US006944066B1

(12) United States Patent
Jing

(10) Patent No.: US 6,944,066 B1
(45) Date of Patent: Sep. 13, 2005

(54) LOW VOLTAGE DATA PATH AND CURRENT SENSE AMPLIFIER

(75) Inventor: Chul Min Jing, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/835,704

(22) Filed: Apr. 29, 2004

(51) Int. Cl.[7] ........................ G11C 7/00
(52) U.S. Cl. ........................ 365/189.05; 365/205
(58) Field of Search ........................ 365/189.01, 189.05, 365/189.11, 205, 207

(56) References Cited

U.S. PATENT DOCUMENTS

| | | | | |
|---|---|---|---|---|
| 5,590,086 | A | 12/1996 | Park et al. | 365/230.03 |
| 6,137,737 | A | 10/2000 | Mullarkey et al. | 365/201 |
| 6,198,681 | B1 | 3/2001 | Forbes | 365/205 |
| 6,212,109 | B1 * | 4/2001 | Proebsting | 365/190 |
| 6,249,471 | B1 | 6/2001 | Roy | 365/207 |
| 6,314,038 | B1 | 11/2001 | Kim et al. | 365/203 |
| 6,373,753 | B1 * | 4/2002 | Proebsting | 365/189.09 |
| 6,411,553 | B1 | 6/2002 | Wright et al. | 365/189.05 |
| 6,418,067 | B1 * | 7/2002 | Watanabe et al. | 365/200 |
| 6,462,998 | B1 * | 10/2002 | Proebsting | 365/205 |
| 6,483,351 | B2 | 11/2002 | Sim | 327/52 |
| 6,483,353 | B2 | 11/2002 | Kim et al. | 327/55 |
| 6,687,161 | B2 | 2/2004 | Marotta et al. | 365/185.21 |
| 6,704,828 | B1 | 3/2004 | Merritt et al. | 710/305 |
| 6,741,104 | B2 | 5/2004 | Forbes et al. | 327/55 |
| 6,754,119 | B2 | 6/2004 | Lee et al. | 365/205 |
| 2002/0149399 | A1 | 10/2002 | Baker | 327/55 |
| 2004/0037114 | A1 | 2/2004 | Abedifard et al. | 365/185.13 |
| 2004/0085840 | A1 | 5/2004 | Vali et al. | 365/202 |

* cited by examiner

*Primary Examiner*—Gene N. Auduong
(74) *Attorney, Agent, or Firm*—Dorsey & Whitney LLP

(57) ABSTRACT

A data path including a local input/output (LIO) line and a global input/output (GIO) line coupled together through an input/output (IO) line coupling circuit. The coupling circuit is coupled to an internal voltage supply, and couples and decouples signal lines of the GIO line from the supply terminal according to read data coupled to the LIO line. The GIO line is coupled to a current sense amplifier to generate output voltage signals that are coupled to an output buffer. An example of a current sense amplifier coupled to the GIO line includes first and second load circuits and first and second n-channel MOS (NMOS) transistors coupled to a respective load circuit. The gates of NMOS transistors are cross coupled, and input current signals are coupled to source terminals of the NMOS transistors and the output voltage signals are coupled from the drain terminals of the NMOS transistors.

38 Claims, 5 Drawing Sheets

LOW VOLTAGE DATA PATH AND CURRENT SENSE AMPLIFIER

TECHNICAL FIELD

The invention relates generally to integrated circuit memory devices, and more particularly, to a data path in a memory device.

BACKGROUND OF THE INVENTION

As the processing speed of microprocessors increases, the demand for memory devices having faster access times also increases. Additionally, the demand for memory devices that are designed for low voltage operation has also increased with the popularity of portable computing devices, which are typically battery operated. Memory system designers have developed methods and designs that shave off nanoseconds from access times in order to satisfy the demand for high speed memory devices while operating under low voltage conditions. Even with the advances made in memory device designs, the fundamental building blocks of memory devices have remained relatively the same. As will be described in more detail below, these building blocks are the basic elements that are shared among all types of memory devices, regardless of whether they are synchronous or asynchronous, random-access or read-only, or static or dynamic.

A conventional memory device is illustrated in FIG. 1. The memory device includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory bank arrays 20 and 22 depending upon the state of a bank address bit forming part of the row address. The arrays 20 and 22 are comprised of memory cells arranged in rows and columns. Associated with each of the arrays 20 and 22 is a respective row address latch 26, which stores the row address, and a row decoder 28, which applies various signals to its respective array 20 or 22 as a function of the stored row address.

After the row address has been applied to the address register 12 and stored in one of the row address latches 26, a column address is applied to the address register 12. The address register 12 couples the column address to a column address latch 40. The column address latch 40 momentarily stores the column address while it is provided to the column address buffer 44. The column address buffer 44 applies a column address to a column decoder 48, which applies various column signals to respective sense amplifiers and associated column circuits 50 and 52 for the respective arrays 20 and 22.

Data to be read from one of the arrays 20 or 22 are coupled from the arrays 20 or 22, respectively, to a data bus 58 through the column circuit 50 or 52, respectively, and a read data path that includes a data output buffer 56. Data to be written to one of the arrays 20 or 22 are coupled from the data bus 58 through a write data path, including a data input buffer 60, to one of the column circuits 50 or 52 where they are transferred to one of the arrays 20 or 22, respectively.

The above-described operation of the memory device 10 is controlled by a command decoder 68 responsive to high level command signals received on a control bus 70. These high level command signals, which are typically generated by the memory controller, are a chip select signal CS*, a write enable signal WE*, a row address strobe signal RAS*, and a column address strobe signal CAS*, where the "*" designates the signal as active low. The command decoder 68 generates a sequence of command signals responsive to the high level command signals to carry out a function (e.g., a read or a write) designated by each of the high level command signals. These command signals, and the manner in which they accomplish their respective functions, are conventional. Therefore, in the interest of brevity, a further explanation of these control signals will be omitted.

As mentioned above, read data are coupled from one of the arrays 20 and 22 to the data bus 58 through a read data path that is shown in greater detail in FIG. 2. FIG. 2 illustrates a conventional data path 100 for a memory device. The data path 100 is coupled through the column decoder 48 and sense amplifiers 112 to the memory cell array 20 that is arranged in rows and columns of memory cells. Only the memory cell array 20 of FIG. 1 is illustrated in order to reduce the complexity of FIG. 2, to which reference will be made in describing the operation of the data path 100. Additionally, as known in the art, the sense amplifiers 112, although not specifically shown in FIG. 1, are typically included in the sense amplifiers and associated column circuits 50 and 52.

Each of the columns of memory cells of the memory cell array 20 is represented by a pair of digit lines coupled to a respective one of the sense amplifiers 112. As known in the art, when the memory cell array 20 is accessed, a row of memory cells (not shown) are activated, and the sense amplifiers 112 amplify data for the respective column by coupling each of the digit lines of the selected column to voltage supplies such that the digit lines have a complementary logic levels. The column decoder 48 then selects one of the columns of memory cells to be coupled to a local input-output (LIO) line 116 of the data path 100 based on a column address. The LIO 116 is represented by a pair of signal lines, each of which is coupled to a respective one of the pair of digit lines by the column decoder 108. At the time the selected column is coupled to the LIO 116, the signal lines of the LIO 116 are precharged to an internal supply voltage VINT through PMOS transistors 120 and 122. A section selection signal SEC activates pass gates 130 and 132 to couple the LIO 116 to global input/output (GIO) line 140. The GIO 140 is represented by a pair of signal lines, which are coupled to a respective one of the pair of signal lines of the LIO 116. PMOS transistors 144 and 146 couple the signal lines of the GIO 140 to the VINT supply for precharging. As discussed in more detail below, since the data path 100 is based on current mode sensing, the signal lines of the LIO 116 and the GIO 140 are coupled to the VINT supply to prevent significant voltage variations of the LIO 116 and GIO 140 when data read from the memory cell array 20 is coupled to the LIO 116 and GIO 140.

A current sense amplifier 150 is coupled to the GIO 140 to sense a current difference between the signal lines of the GIO 140 and generate voltage output signals CLAT and CLAT_ in response to the current difference. The output signals CLAT and CLAT_ have complementary logic levels, CLAT being the "true" logic level and CLAT_ being the "not true" logic level, as indicated by the underscore "_". The CLAT and CLAT_ signals are coupled to a conventional output buffer to provide an output data signal at an external data terminal. The current sense amplifier 150 includes a pair of PMOS transistors 154, 156 for coupling respective signal lines of the GIO 140 to the VINT supply, and further includes a pair of cross coupled PMOS transistors 160, 164 and a pair of diode coupled NMOS transistors 170, 174 coupled to a drain of a respective PMOS transistor 160, 164. The CLAT and CLAT_ output signals are taken from output nodes 180, 184 corresponding to the drain of the PMOS transistors 160, 164. Coupled to the sources of the NMOS transistors 170, 174 is a NMOS selection transistor 180 for coupling the NMOS transistors 170, 174 to ground in response to an active selection signal SEL. It will be appreciated that FIG. 1 is a partial functional block diagram and is provided by way of example, and other functional blocks have been omitted from the data path 100 to avoid overcomplicating the description of operating the data path 100.

In operation, when a memory cell is read, a selected pair of digit lines of a column of memory is coupled to the LIO 116 by the column decoder 48 and the pass-gates 130, 132 are activated to couple the LIO 116 to the GIO 140, as known. A current difference is created in the pairs of signals lines in response to the data state of the memory cell being read. The current difference is detected by the current sense amplifier 150 by creating a current imbalance in the PMOS/diode coupled NMOS legs 160, 170 and 164, 174. The current imbalance results in a voltage difference at the respective output nodes 180, 184, which is further amplified as one of the cross coupled PMOS transistors 160, 164 becomes saturated and the other becomes cutoff. In this manner, the CLAT and CLAT_ signals achieve complementary logic levels.

Typically, the GIO lines 140 are physically long signal lines that are routed over the memory device to selectively couple, based on the selective activation of the SEC signal, physically shorter LIO lines 116 to a respective current sense amplifier 150. As a result, the GIO 140 have considerable line impedance that can significantly increase the time for sensing read data from the memory cell array 20 when voltage mode sensing is used. The current mode operation of the data path 100 has the advantage of avoiding the need to drive the signal lines of the GIO 140 to two voltage extremes as in the case for voltage mode sensing. Additionally, current mode operation allows for the voltage levels between the pairs of signal lines for the LIO 116, as well as the signal lines of the GIO 140, to be maintained at a relatively constant voltage. Thus, precharging and equilibrating time for the signal lines of the LIO 116, and of the GIO 140, can be shortened relative to memory devices employing voltage mode operation. As a result, access times can be shortened as well.

Conventional current mode data paths, such as the data path 100, however, suffer when operated at low internal voltage levels. In order to operate properly, the data path 100 requires that the VINT voltage level is greater than the total voltage drop across the LIO 116, the GIO 140, and the PMOS/diode coupled NMOS legs 160, 170 or 164, 174. The voltage drop across the LIO 116 result from coupling a pair of digit lines to the respective signal lines of the LIO 116, and the voltage drop across the GIO 140 includes the voltage drop across the pass gates 130, 132, the precharge PMOS transistors 144, 146, and inherent line resistance of the typically lengthy signal lines of the GIO 140. The voltage drop across the PMOS/diode coupled NMOS legs 160, 170 or 164, 174, is (Vtp+Vdpsat)+(Vtn+Vdnsat), where Vtp is the threshold voltage of the PMOS transistors 160, 164, Vdpsat is the saturation voltage of the PMOS transistors 160, 164, Vtn is the threshold voltage of the NMOS transistors 170, 174, and Vtnsat is the saturation voltage of the NMOS transistors 170, 174.

When using typical operating currents and device characteristics for the data path 100, operation at a voltage level of 1.5 volts is satisfactory. However, where it is desirable to implement the data path 100 under operating conditions having voltage levels approaching 1.0 volts, the data path 100 may not consistently or accurately sense data read from the memory cell array 104. As a result, a read error occurs. Therefore, there is a need for a data path that can accurately and consistently sense read data under low voltage operating conditions.

SUMMARY OF THE INVENTION

A data path according to one embodiment of the present invention couples read data from a read/write circuit to an output buffer. The data path includes a local input/output (LIO) line coupled to the read/write circuit and an input/output (IO) line coupling circuit having first and second control terminals coupled to first and second signal lines of the LIO line. The coupling circuit has a supply terminal coupled to an internal voltage supply, and first and second output nodes to which the supply terminal is coupled and from which the supply terminal is decoupled according to the complementary data coupled to the first and second signal lines of the LIO line. The data path further includes a global input/output (GIO) line coupled to the output terminals of the IO line coupling circuit and further coupled to an output data amplifier for generating complementary output voltage signals based on input currents coupled over the GIO line to the output data amplifier.

Another aspect of the present invention provides a current sense amplifier for generating complementary output voltage signals in response to input current signals. The current sense amplifier includes first and second load circuits, each of which has a first terminal coupled to an internal voltage supply and a second terminal. The current sense amplifier further includes first and second n-channel MOS (NMOS) transistors having a drain terminal coupled to the second terminal of a respective load circuit, a gate terminal coupled to the drain terminal of the other NMOS transistor, and a source terminal. The input current signals are coupled to the source terminals of the NMOS transistors and the complementary output voltage signals are coupled from the drain terminals of the NMOS transistors. A precharge circuit included in the current sense amplifier is coupled to the source terminals of the first and second NMOS transistors and couples the source terminals to a ground to prepare the current sense amplifier for sensing.

In another aspect of the present invention, a data path couples data from a read/write circuit to an output buffer and includes a current sense amplifier for generating complementary output voltage signals in response to input current signals. The current sense amplifier includes first and second load circuits, each load circuit having a first terminal coupled to an internal voltage supply and further having a second terminal. The current sense amplifier further includes first and second n-channel MOS (NMOS) transistors, each NMOS transistor having a drain terminal coupled to the second terminal of a respective load circuit and further coupled to the output buffer to provide the complementary output voltage signals, a gate terminal coupled to the drain terminal of the other NMOS transistor, and a source terminal coupled to a respective signal line of a global input/output line to receive the input current signals. A precharge circuit is also coupled to the source terminals of the first and second NMOS transistors to couple the source terminals to a ground to prepare the current sense amplifier for sensing.

DETAILED DESCRIPTION OF PREFERRED EMBODIMENTS

Figure 3:
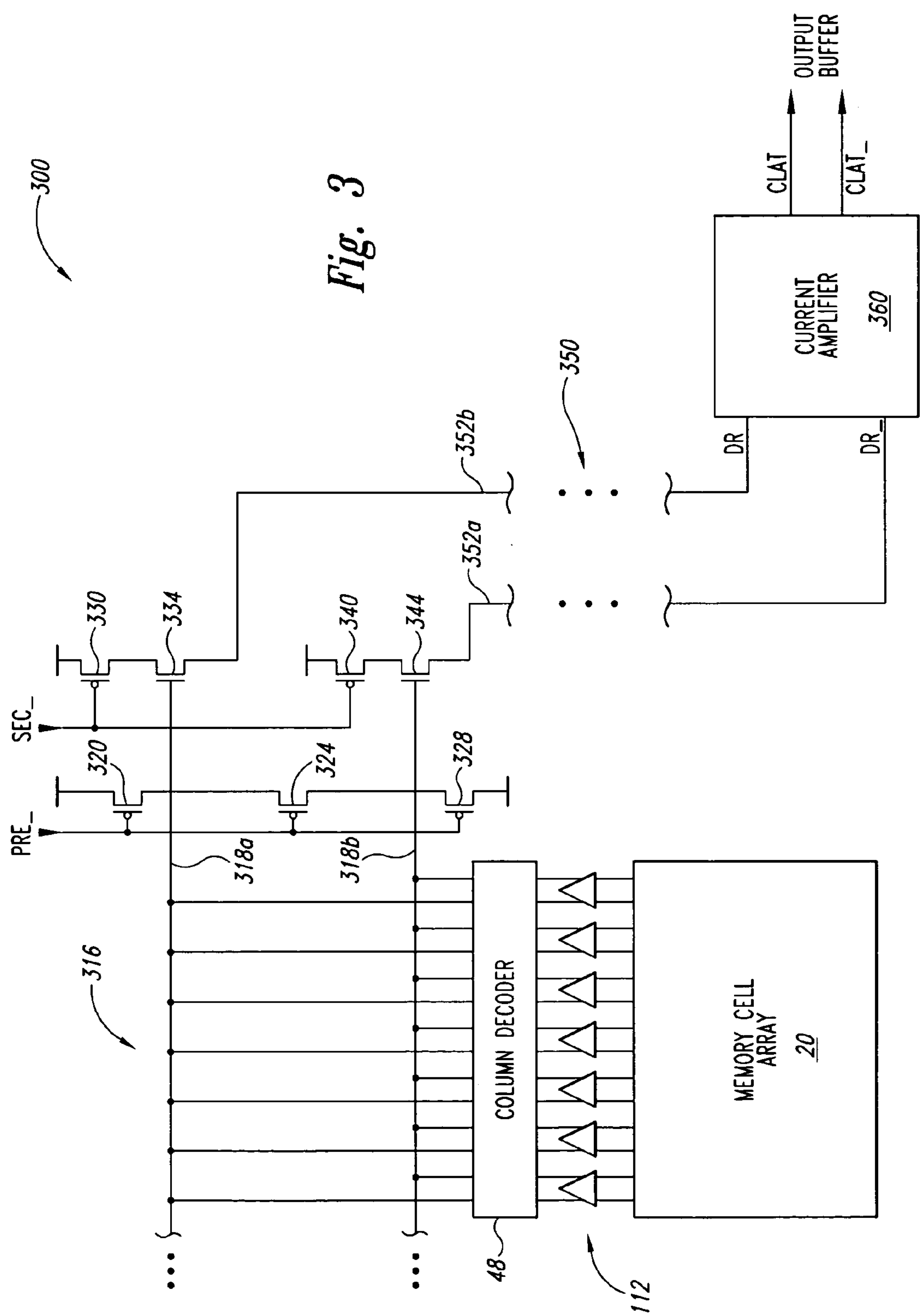
FIG. 3 is a partial block diagram of a data path according to an embodiment of the present invention that can be implemented in the memory device of FIG. 1.

FIG. 3 illustrates a data path 300 according to an embodiment of the present invention. The data path 300 can be operated under low voltage conditions, such as in memory devices designed for low voltage operation. Certain details are set forth below to provide a sufficient understanding of the invention. However, it will be clear to one skilled in the art that the invention may be practiced without these particular details. In other instances, well-known circuits, control signals, timing protocols, and software operations have not been shown in detail in order to avoid unnecessarily obscuring the invention.

The data path 300 includes elements similar to the data path 100 (FIG. 2), and where appropriate, the same reference number is used to refer to the same element. The data path 300 is coupled through the column decoder 48 and sense amplifiers 112 to the memory cell array 20, which is arranged in rows and columns of memory cells. The column decoder 48 selectively couples the pair of digit lines of a selected column of memory to a local input-output (LIO) line 316. As shown in FIG. 3, the LIO 316 is represented by a pair of signal lines 318*a*, 318*b*. PMOS transistors 320, 324, 328 are coupled to the LIO 316 for precharging the signal lines 318*a*, 318*b* to an internal voltage level VINT in response to an active LOW precharge signal PRE_. That is, when the PRE_ signal has a LOW logic level, the PMOS transistors 320, 324, 328 are activated to couple the signal lines 318*a*, 318*b* to a VINT voltage supply, as well as to couple the signal lines to each other to balance the voltage levels.

Figure 1:
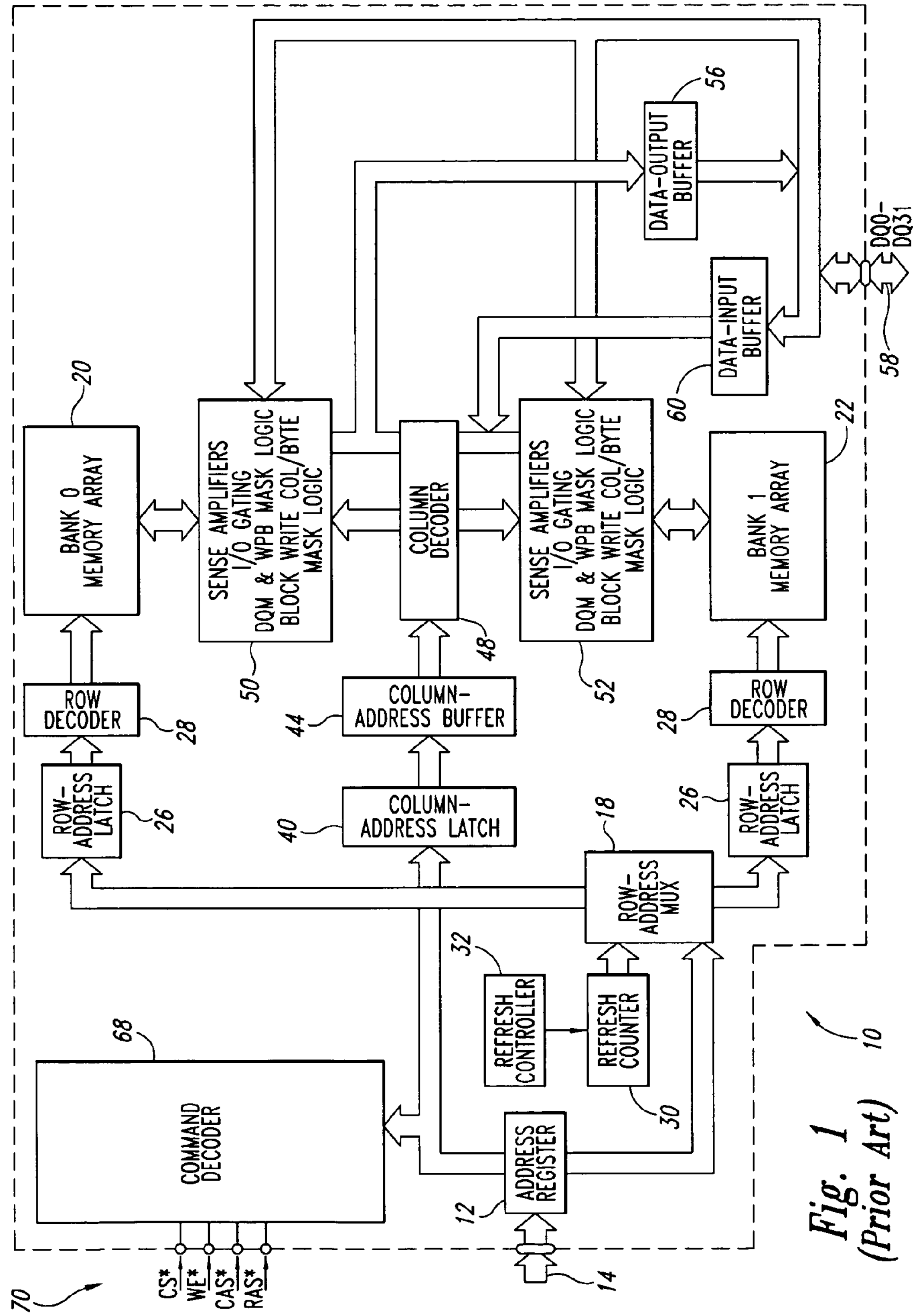
FIG. 1 is a block diagram of a conventional memory device.

Each of the signal lines 318*a*, 318*b* of the LIO 316 are coupled to a gate of a respective NMOS transistor 334, 344. The drains of the NMOS transistors are coupled to drains of respective PMOS transistors 330, 340, which couple the NMOS transistors to 334, 344, respectively, to a VINT voltage supply in response to an active LOW section selection signal SEC_. The sources of the NMOS transistors 334, 344 are coupled to respective signal lines 352*a*, 352*b* of a global input-output (GIO) line 350. As with the conventional data path 100 (FIG. 1), the signal lines 352*a*, 352*b* of the GIO 350 are typically physically long lines that have relatively significant inherent line impedance. A current sense amplifier 360 is coupled to the GIO 350 to detect current differences between the two signal lines 352*a*, 352*b* and generate output voltage signals CLAT, CLAT_ in response to the sensing. The CLAT and CLAT_ signals have complementary logic levels, and are provided to the output buffer 56 (FIG. 1).

In operation, the LIO 316 is initially precharged to the VINT voltage level by a LOW PRE_ signal and the GIO 350 is precharged to a precharge voltage VPRE, which is typically approximately one-half the VINT voltage level. It will be appreciated by those ordinarily skilled in the art, however, that different voltage levels can be used to precharge the signal lines 352*a*, 352*b*, as well as the signal lines 318*a*, 318*b*, without departing from the scope of the present invention. As a result of the HIGH logic level of the signal lines 352*a*, 352*b*, the NMOS transistors are switched ON. In preparation for a memory access operation, the PRE_ signal returns to a HIGH logic level, and the SEC_ signal becomes LOW, switching ON the PMOS transistors 330, 340. At this time, the signal lines 352*a*, 352*b* of the GIO 350 are coupled to the VINT voltage supply. Although the signal lines 352*a*, 352*b* are precharged to the VPRE voltage level, and are now coupled to the VINT voltage supply, the voltage level of each of the signal lines 352*a*, 352*b* does not immediately change due to the inherent line loading of the signal lines 352*a*, 352*b*. Prior to voltage level of the signal lines 352*a*, 352*b* changing to the VINT voltage, the column decoder 48 selectively couples the digit lines of a selected column of memory to the signal lines 318*a*, 318*b* of the LIO 316. The voltage levels of the signal lines 318*a*, 318*b* change to complementary logic levels in response to the coupling of the digit lines, which causes one of the NMOS transistors 334, 344 to switch OFF. The signal line 352*a*, 352*b* coupled to the NMOS transistor 334, 344 that is switched OFF is now decoupled from the VINT voltage supply. As a result, a current difference is created between the signal lines 352*a*, 352*b*, with current flowing in the signal line still coupled to the VINT voltage supply and no current flowing in the signal line coupled to the NMOS transistors 334, 344 that is switched OFF. The current difference is detected by the current sense amplifier 360 and complementary output voltage signals CLAT and CLAT_ are generated accordingly.

Figure 2:
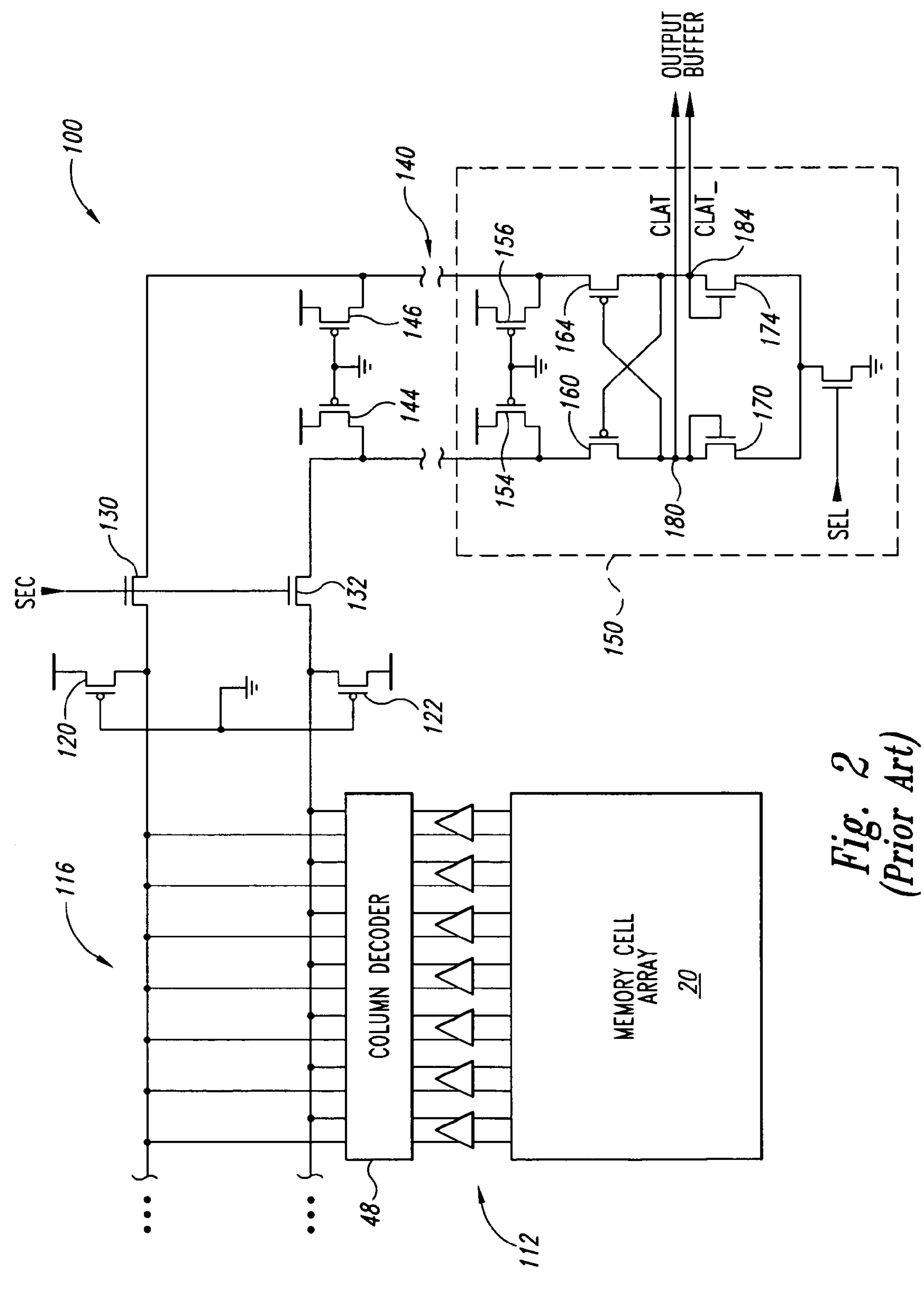
FIG. 2 is a partial block diagram of a conventional data path of the memory device of FIG. 1.

The data path 300 employs a "quasi-source follower" of NMOS transistors 334, 344 in its current mode sensing operation rather than using pass gates 130, 132 as in the conventional data path 100 (FIG. 2). In this manner, the voltage drop across the LIO 316 can be avoided since the voltage levels of the signal lines 318*a*, 318*b* are used to switch ON and OFF the NMOS transistors 334, 344 to couple one of the signal lines 352*a*, 352*b* to the VINT voltage supply and decouple the other rather than drive currents in the signal lines 352*a*, 352*b* of the GIO line 350.

It will be appreciated that one ordinarily skilled in the art will obtain sufficient understanding from the description provided herein to select device characteristics of the MOS transistors included in the data path 300 to practice the invention. Additionally, the data path 300 can be implemented using conventional devices and designs well known in the art, as well as those devices and designs later developed. The current sense amplifier 360 is conventional, and various known designs for the current sense amplifier 360 can be used without departing from the scope of the present invention.

Figure 4:
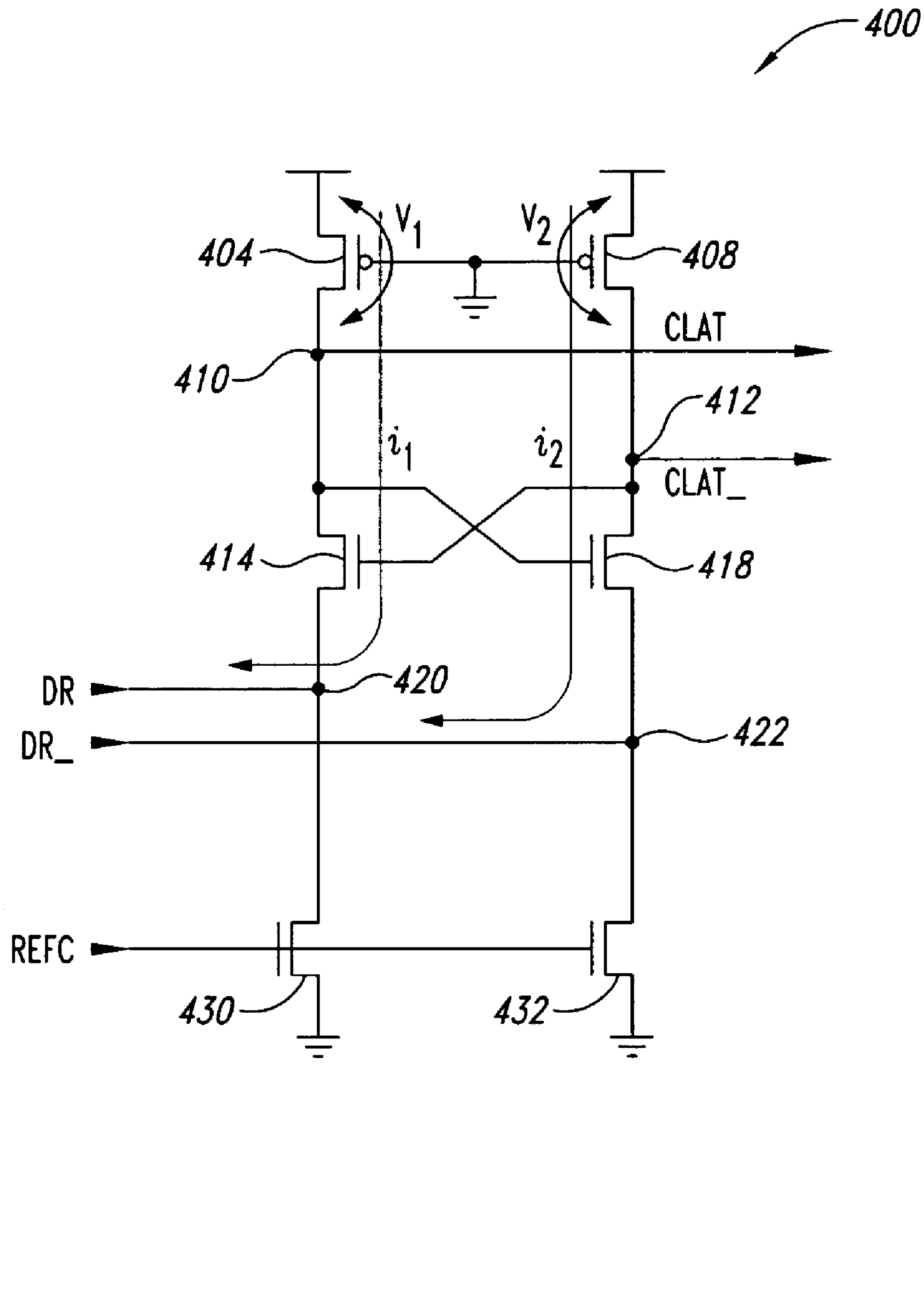
FIG. 4 is a schematic drawing of a current sense amplifier according to an embodiment of the present invention that can be used in the data path of FIG. 3 and the data path of FIG. 2.

FIG. 4 illustrates a current sense amplifier 400 according to an embodiment of the present invention. The current sense amplifier 400 can be substituted for the current sense amplifier 360 shown in FIG. 3. The current sense amplifier 400 includes a pair of PMOS transistors 404, 408 having drains coupled to respective drains of NMOS transistors 414, 418. The PMOS transistors 404, 408 have gates coupled to ground, and consequently, operate in the linear region of the transistor to provide resistive loading. The gates of the NMOS transistors 414, 418 are cross coupled to the nodes 412, 410, respectively. The current sense amplifier 400 further includes precharge NMOS transistors 430, 432 for coupling the drains of the NMOS transistors 414, 418 to ground when the signal REFC is HIGH. The input currents are coupled to nodes 420, 422 of the current sense amplifier 400, and the voltage output signals CLAT and CLAT_ are coupled from the nodes 412, 410. As shown in FIG. 4, the signal lines 352*a*, 352*b* of the GIO 350 (FIG. 3) are coupled to the nodes 422, 420, respectively.

In operation, the current sense amplifier 400 detects current differences between the currents $i_1$ and $i_2$ shown in FIG. 4 and generates CLAT and CLAT_ output voltage signals in response. Following precharge of the current sense amplifier 400, it is assumed that the currents $i_1$ and $i_2$ are equal. With respect to the previous description of the data path 300, the currents $i_1$ and $i_2$ are equal after the SEC_ signal has switched to a LOW logic level to couple the signal lines 318*a*, 318*b* to the VINT voltage supply, but prior to the column decoder 48 coupling the digit lines of the selected column of memory to the signal lines 318*a*, 318*b* of the LIO 316. As also previously described, in response to the coupling of digit lines to the signal lines 318*a*, 318*b*, one of the signal lines 352*a*, 352*b* of the GIO 350 is decoupled from the VINT voltage supply. As a result, current will continue to flow in one signal line but not the other, causing a current difference between the signal lines 352*a*, 352*b* to be present. Since the PMOS transistors 404, 408 are operating in the linear region of the transistor, each of the PMOS transistors 404, 408 behaves as a resistor and the current difference between the currents $i_1$ and $i_2$ will cause a difference in the voltage dropped across the PMOS transistors 404, 408, shown in FIG. 4 as V1 and V2, respectively. As a result, one of the voltages V1, V2 will increase relative to the other voltage. Keeping in mind that the inherent loading of the signal lines 352*a*, 352*b* of the GIO 350 prevents the voltage levels of the signal lines 352*a*, 352*b* from changing quickly, as the voltage across one of the PMOS transistors 404, 408 increases, the gate-source voltage will decrease for the NMOS transistor 414, 418 having its gate coupled to the PMOS transistor that is dropping more voltage. The decreasing gate-source voltage will cause the drain voltage of the same NMOS transistor to increase. The increasing drain voltage of the NMOS transistor provides positive feedback to cause the other NMOS transistor to sink more current. As a result, the voltage dropped across the PMOS further increases. With the voltage dropped across the PMOS transistor continuing to increase, and the drain voltage of the NMOS transistor 414, 418 having its gate coupled to that PMOS transistor continuing to increase, the output signals CLAT and CLAT_ are quickly forced to complementary logic levels.

Following the output of the complementary CLAT and CLAT_ signals, the current sense amplifier 400 can be reset in preparation for another current sensing operation by pulsing the REFC signal to switch ON the NMOS transistors 430, 432 for the duration of the pulse. By coupling the sources of the NMOS transistors 420, 422 to ground, the respective gate-source voltages will be equalized.

It will be appreciated by those ordinarily skilled in the art that the relationship between the currents $i_1$ and $i_2$ and the voltage at the respective nodes 420, 422 represents a "negative ac resistance." That is, for an increasing $i_1$ current, the voltage at the node 420 increase as well. The same negative resistance effect occurs at the node 422 in the case when the $i_2$ current increases. It will be further appreciated that the current sense amplifier can quickly generate complementary CLAT and CLAT_ signals because of the regenerative action of the positive feedback latch formed by the cross-coupled NMOS transistors 414, 418. As a result of the negative resistance and the regenerative action of the current sense amplifier 400, sensing speed is relatively faster than a conventional current sense amplifier because of the positive feedback, the nodes 420, 422 can be maintained at higher voltage levels to provide good signal source drivability, and the signal lines 352*a*, 352*b* of the GIO350, when coupled to the data path 300, are easier to equalize between sensing operations because the voltage levels do not significantly change during the sensing operation itself. These benefits, when implemented in a memory device, can contribute to reducing the overall access cycle time. It will be appreciated by those ordinarily skilled in the art that the benefits previously described may be achieved to a greater or lesser extent without departing from the scope of the present invention.

The current sense amplifier 400, when used with the data path 300 (FIG. 3) allows for operability of the data path 300 in even lower voltage conditions. As previously explained with respect to the conventional data path, for operability the internal voltage should be greater than the voltage drop across the LIO 116, the GIO 140, and the PMOS/diode coupled NMOS legs 160, 170 or 164, 174 (FIG. 2). Under low voltage operating conditions approaching 1.0 volt, the conventional data path can fail to sense data of a memory cell accurately because of this voltage drop. In comparison to the data path 100, the minimum internal voltage level for the data path 300 when coupled to the current sense amplifier 400 needs to be greater than the voltage drop across the NMOS transistors 334, 344, across the GIO 350, and across the NMOS transistors 414, 418. The total voltage drop for the data path 300 and the current sense amplifier 400 is less than that for the data path 100 and the current sense amplifier 150 (FIG. 2). As a result, the data path 300 and the current sense amplifier 400 can operate at a lower voltage than the conventional arrangement shown in FIG. 2. Some embodiments of the present invention may be operated in a voltage range as low as 0.6 volts.

Although described in operation with the data path 300 having a quasi-source follower current sensing scheme, the current sense amplifier 400 can also be used with conventional data paths as well. For example, the current sense amplifier 400 can be coupled to the conventional data path 100 (FIG. 2) in which pass gates 130, 132 are used to couple the signal lines of the LIO 116 to the signal lines of the GIO 140. In addition to the benefits resulting from the negative resistance and the regenerative action of the current sense amplifier 400 previously discussed, the current sense amplifier 400 can be used advantageously with the data path 100 to enable operation at lower voltages than for the conventional current sense amplifier, such as the current sense amplifier 150 of FIG. 2, since the voltage drop for the current sense amplifier 400 is less than that for the current sense amplifier 150.

Figure 5:
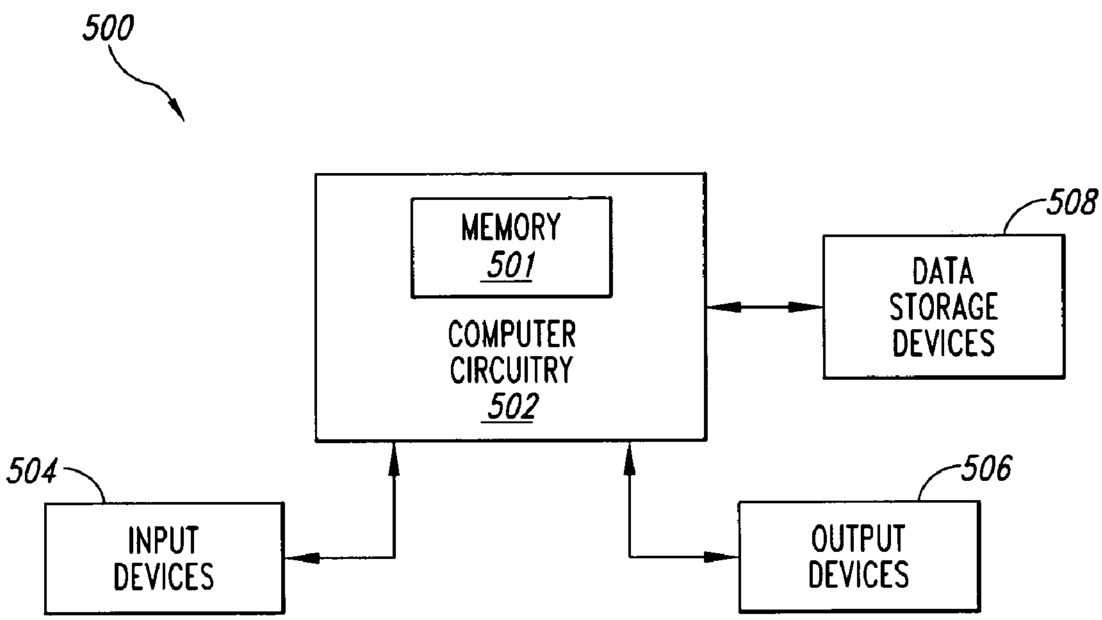
FIG. 5 is a functional block diagram of a processor-based system having a memory device in which the data path according to an embodiment of the present invention is implemented.

FIG. 5 is a block diagram of a processor-based system 500 including computer circuitry 502 having a memory device 501 in which a data path according to an embodiment of the present invention is included. Typically, the computer circuitry 502 is coupled through address, data, and control buses to the memory device 501 to provide for writing data to and reading data from the memory device. The computer circuitry 502 includes circuitry for performing various computing functions, such as executing specific software to perform specific calculations or tasks. In addition, the computer system 500 includes one or more input devices 504, such as a keyboard or a mouse, coupled to the computer circuitry 502 to allow an operator to interface with the computer system. Typically, the computer system 500 also includes one or more output devices 506 coupled to the computer circuitry 502, such as output devices typically including a printer and a video terminal. One or more data storage devices 508 are also typically coupled to the computer circuitry 502 to store data or retrieve data from external storage media (not shown). Examples of typical storage devices 508 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. Such modifications are well within the skill of those ordinarily skilled in the art. Accordingly, the invention is not limited except as by the appended claims.

What is claimed is:

1. A data path coupled to a read/write circuit for coupling data from the read/write circuit to an output buffer, the data path comprising:

a local input/output (LIO) line coupled to the read/write circuit, the LIO having first and second signal lines to which complementary data from the read/write circuit are coupled;

an input/output (IO) line coupling circuit having first and second control terminals coupled to the first and second signal lines of the LIO line, respectively, a supply terminal coupled to an internal voltage supply, and first and second output nodes to which the supply terminal is coupled and from which the supply terminal is decoupled according to the complementary data coupled to the first and second signal lines of the LIO line, respectively;

a global input/output (GIO) line having first and second signal lines coupled to the first and second output terminals of the IO line coupling circuit; and an output data amplifier coupled to the first and second signal lines of the GIO line and adapted to generate complementary output voltage signals at output terminals coupled to the output buffer based on input currents coupled over the GIO line to the output data amplifier.

2. The data path of claim 1 wherein the IO line coupling circuit comprises:

first and second p-channel MOS (PMOS) transistors, each having a source terminal coupled to the internal voltage supply, a gate terminal to which a selection signal is applied, and a drain terminal; and first and second n-channel MOS (NMOS) transistors, each having a drain terminal coupled to a drain terminal of a respective PMOS transistor, a gate terminal coupled to a respective signal line of the LIO line, and a source terminal coupled to a respective signal line of the GIO line.

3. The data path of claim 1 wherein the output data amplifier is a current sense amplifier.

4. The data path of claim 3 wherein the current sense amplifier comprises:

first and second load circuits, each load circuit having a first terminal coupled to an internal voltage supply and further having a second terminal;

first and second n-channel MOS (NMOS) transistors, each NMOS transistor having a drain terminal coupled to the second terminal of a respective load circuit and further coupled to the output buffer to provide the complementary output voltage signals, a gate terminal coupled to the drain terminal of the other NMOS transistor, and a source terminal coupled to a respective signal line of the GIO line to receive the input current signals; and a precharge circuit coupled to the source terminals of the first and second NMOS transistors and adapted to couple the source terminals to a ground to prepare the current sense amplifier for sensing.

5. The data path of claim 4 wherein the precharge circuit comprises first and second precharge transistors, each having a drain coupled to the source of a respective NMOS transistor, a gate terminal to which a precharge activation signal is applied, and a source coupled to ground.

6. The data path of claim 1, further comprising:

first and second precharge transistors coupled to the first and second signal lines of the LIO line, respectively, to couple the respective signal line to the internal voltage supply in response to an active precharge signal; and a balancing transistor coupled to the first and second signal lines of the LIO line to couple the same together in response to the active precharge signal.

7. A current sense amplifier for generating complementary output voltage signals in response to input current signals, the current sense amplifier comprising:

first and second load circuits, each load circuit having a first terminal coupled to an internal voltage supply and further having a second terminal;

first and second n-channel MOS (NMOS) transistors, each NMOS transistor having a drain terminal coupled to the second terminal of a respective load circuit, a gate terminal coupled to the drain terminal of the other NMOS transistor, and a source terminal, the input current signals coupled to the source terminals of the NMOS transistors and the complementary output voltage signals coupled from the drain terminals of the NMOS transistors; and a precharge circuit coupled to the source terminals of the first and second NMOS transistors and adapted to couple the source terminals to a ground to prepare the current sense amplifier for sensing.

8. The current sense amplifier of claim 7 wherein the precharge circuit comprises first and second precharge transistors, each having a drain coupled to the source of a respective NMOS transistor, a gate terminal to which a precharge activation signal is applied, and a source coupled to ground.

9. The current sense amplifier of claim 7 wherein the first and second load circuits comprise resistive load devices.

10. The current sense amplifier of claim 7 wherein the first and second load circuits comprises first and second p-channel MOS (PMOS) transistors, each having a source terminal coupled to the internal voltage supply, a gate coupled to ground, and a drain terminal coupled to the drain of a respective NMOS transistor.

11. A data path coupled to a read/write circuit for coupling data from the read/write circuit to an output buffer, the data path comprising:

a local input/output (LIO) line coupled to the read/write circuit, the LIO having first and second signal lines to which complementary data from the read/write circuit are coupled;

an input/output (IO) line coupling circuit having first and second control terminals coupled to the first and second signal lines of the LIO line, respectively, a supply terminal coupled to an internal voltage supply, and first and second output nodes to which the supply terminal is coupled and from which the supply terminal is decoupled according to the complementary data coupled to the first and second signal lines of the LIO line, respectively;

a global input/output (GIO) line having first and second signal lines coupled to the first and second output terminals of the IO line coupling circuit; and a current sense amplifier for generating complementary output voltage signals in response to input current signals, the current sense amplifier including first and second load circuits, each load circuit having a first terminal coupled to an internal voltage supply and further having a second terminal, and including first and second n-channel MOS (NMOS) transistors, each NMOS transistor having a drain terminal coupled to the second terminal of a respective load circuit and further coupled to the output buffer to provide the complementary output voltage signals, a gate terminal coupled to the drain terminal of the other NMOS transistor, and a source terminal coupled to a respective signal line of the GIO line to receive the input current signals, the current sense amplifier further including a precharge circuit coupled to the source terminals of the first and second NMOS transistors and adapted to couple the source terminals to a ground to prepare the current sense amplifier for sensing.

12. The data path of claim 11 wherein the IO line coupling circuit comprises:

first and second p-channel MOS (PMOS) transistors, each having a source terminal coupled to the internal voltage supply, a gate terminal to which a selection signal is applied, and a drain terminal; and first and second n-channel MOS (NMOS) transistors, each having a drain terminal coupled to a drain terminal of a respective PMOS transistor, a gate terminal coupled to a respective signal line of the LIO line, and a source terminal coupled to a respective signal line of the GIO line.

13. The data path of claim 11, further comprising:

first and second precharge transistors coupled to the first and second signal lines of the LIO line, respectively, to couple the respective signal line to the internal voltage supply in response to an active precharge signal; and a balancing transistor coupled to the first and second signal lines of the LIO line to couple the same together in response to the active precharge signal.

14. The data path of claim 11 wherein the output data amplifier is a current sense amplifier.

15. The data path of claim 14 wherein the current sense amplifier comprises:

first and second load circuits, each load circuit having a first terminal coupled to an internal voltage supply and further having a second terminal;

first and second n-channel MOS (NMOS) transistors, each NMOS transistor having a drain terminal coupled to the second terminal of a respective load circuit and further coupled to the output buffer to provide the complementary output voltage signals, a gate terminal coupled to the drain terminal of the other NMOS transistor, and a source terminal coupled to a respective signal line of the GIO line to receive the input current signals; and a precharge circuit coupled to the source terminals of the first and second NMOS transistors and adapted to couple the source terminals to a ground to prepare the current sense amplifier for sensing.

16. The data path of claim 15 wherein the precharge circuit comprises first and second precharge transistors, each having a drain coupled to the source of a respective NMOS transistor, a gate terminal to which a precharge activation signal is applied, and a source coupled to ground.

17. The data path of claim 15 wherein the first and second load circuits of the current sense amplifier comprise resistive load devices.

18. The data path of claim 15 wherein the first and second load circuits of the current sense amplifier comprises first and second p-channel MOS (PMOS) transistors, each having a source terminal coupled to the internal voltage supply, a gate coupled to ground, and a drain terminal coupled to the drain of a respective NMOS transistor.

19. A memory device comprising:

an address bus;

a control bus;

an address decoder coupled to the address bus;

a control circuit coupled to the control bus;

a memory-cell array coupled to the address decoder and control circuit a read/write circuit coupled to the memory-cell array;

an output data buffer; and a data path coupled to a read/write circuit and the output data buffer for coupling data from the read/write circuit to the output data buffer, the data path comprising:

a local input/output (LIO) line coupled to the read/write circuit, the LIO having first and second signal lines to which complementary data from the read/write circuit are coupled;

an input/output (IO) line coupling circuit having first and second control terminals coupled to the first and second signal lines of the LIO line, respectively, a supply terminal coupled to an internal voltage supply, and first and second output nodes to which the supply terminal is coupled and from which the supply terminal is decoupled according to the complementary data coupled to the first and second signal lines of the LIO line, respectively;

a global input/output (GIO) line having first and second signal lines coupled to the first and second output terminals of the IO line coupling circuit; and an output data amplifier coupled to the first and second signal lines of the GIO line and adapted to generate complementary output voltage signals at output terminals coupled to the output data buffer based on input currents coupled over the GIO line to the output data amplifier.

20. The memory device of claim 19 wherein the IO line coupling circuit of the data path comprises:

first and second p-channel MOS (PMOS) transistors, each having a source terminal coupled to the internal voltage supply, a gate terminal to which a selection signal is applied, and a drain terminal; and first and second n-channel MOS (NMOS) transistors, each having a drain terminal coupled to a drain terminal of a respective PMOS transistor, a gate terminal coupled to a respective signal line of the LIO line, and a source terminal coupled to a respective signal line of the GIO line.

21. The memory device of claim 19 wherein the output data amplifier of the data path is a current sense amplifier.

22. The memory device of claim 21 wherein the current sense amplifier of the data path comprises:

first and second load circuits, each load circuit having a first terminal coupled to an internal voltage supply and further having a second terminal;

first and second n-channel MOS (NMOS) transistors, each NMOS transistor having a drain terminal coupled to the second terminal of a respective load circuit and further coupled to the output buffer to provide the complementary output voltage signals, a gate terminal coupled to the drain terminal of the other NMOS transistor, and a source terminal coupled to a respective signal line of the GIO line to receive the input current signals; and a precharge circuit coupled to the source terminals of the first and second NMOS transistors and adapted to couple the source terminals to a ground to prepare the current sense amplifier for sensing.

23. The memory device of claim 22 wherein the precharge circuit comprises first and second precharge transistors, each having a drain coupled to the source of a respective NMOS transistor, a gate terminal to which a precharge activation signal is applied, and a source coupled to ground.

24. The memory device of claim 19 wherein the data path further comprises:

first and second precharge transistors coupled to the first and second signal lines of the LIO line, respectively, to couple the respective signal line to the internal voltage supply in response to an active precharge signal; and a balancing transistor coupled to the first and second signal lines of the LIO line to couple the same together in response to the active precharge signal.

25. A processor-based system, comprising:

a data input device;

a data output device;

a processor coupled to the data input and output devices; and a memory device coupled to the processor, the memory device comprising:

an address bus;

a control bus;

an address decoder coupled to the address bus;

a control circuit coupled to the control bus;

a memory-cell array coupled to the address decoder and control circuit a read/write circuit coupled to the memory-cell array;

an output data buffer; and a data path coupled to a read/write circuit and the output data buffer for coupling data from the read/write circuit to the output data buffer, the data path comprising:

a local input/output (LIO) line coupled to the read/write circuit, the LIO having first and second signal lines to which complementary data from the read/write circuit are coupled;

an input/output (IO) line coupling circuit having first and second control terminals coupled to the first and second signal lines of the LIO line, respectively, a supply terminal coupled to an internal voltage supply, and first and second output nodes to which the supply terminal is coupled and from which the supply terminal is decoupled according to the complementary data coupled to the first and second signal lines of the LIO line, respectively;

a global input/output (GIO) line having first and second signal lines coupled to the first and second output terminals of the IO line coupling circuit; and an output data amplifier coupled to the first and second signal lines of the GIO line and adapted to generate complementary output voltage signals at output terminals coupled to the output data buffer based on input currents coupled over the GIO line to the output data amplifier.

26. The processor-based system of claim 25 wherein the IO line coupling circuit of the data path comprises:

first and second p-channel MOS (PMOS) transistors, each having a source terminal coupled to the internal voltage supply, a gate terminal to which a selection signal is applied, and a drain terminal; and first and second n-channel MOS (NMOS) transistors, each having a drain terminal coupled to a drain terminal of a respective PMOS transistor, a gate terminal coupled to a respective signal line of the LIO line, and a source terminal coupled to a respective signal line of the GIO line.

27. The processor-based system of claim 25 wherein the output data amplifier of the data path is a current sense amplifier.

28. The processor-based system of claim 27 wherein the current sense amplifier of the data path comprises:

first and second load circuits, each load circuit having a first terminal coupled to an internal voltage supply and further having a second terminal;

first and second n-channel MOS (NMOS) transistors, each NMOS transistor having a drain terminal coupled to the second terminal of a respective load circuit and further coupled to the output buffer to provide the complementary output voltage signals, a gate terminal coupled to the drain terminal of the other NMOS transistor, and a source terminal coupled to a respective signal line of the GIO line to receive the input current signals; and a precharge circuit coupled to the source terminals of the first and second NMOS transistors and adapted to couple the source terminals to a ground to prepare the current sense amplifier for sensing.

29. The processor-based system of claim 28 wherein the precharge circuit comprises first and second precharge transistors, each having a drain coupled to the source of a respective NMOS transistor, a gate terminal to which a precharge activation signal is applied, and a source coupled to ground.

30. The processor-based system of claim 25 wherein the data path further comprises:

first and second precharge transistors coupled to the first and second signal lines of the LIO line, respectively, to couple the respective signal line to the internal voltage supply in response to an active precharge signal; and a balancing transistor coupled to the first and second signal lines of the LIO line to couple the same together in response to the active precharge signal.

31. A method of coupling data from a read/write circuit to an output buffer, comprising:

coupling first and second signal lines of a global input/output line to an internal voltage supply;

coupling read data to first and second signal lines of a local input/output line;

decoupling the first or second signal lines of the global input/output line from the internal voltage supply based on the read data coupled to the signal lines of the local input/output line;

sensing a current difference between the first and second signal lines of the global input/output lines after decoupling; and generating an output voltage signal based on the current difference to provide to the output buffer.

32. The method of claim 31 wherein coupling first and second signal lines of a global input/output line to an internal voltage supply comprise activating first and second pairs of transistors, each pair coupled in series between the internal voltage supply and a respective signal line of the global input/output line.

33. The method of claim 32 wherein decoupling the first or second signal lines of the global input/output line from the internal voltage supply based on the read data coupled to the signal lines of the local input/output line comprises deactivating one of the pair of transistors of either the first or second pairs of transistors in response to the coupling of the read data to the first and second signal lines.

34. The method of claim 33, further comprising precharging the first and second signal lines of the local input/output line to a precharge voltage level.

35. The method of claim 34 wherein precharging the first and second signal lines of the local input/output line to a precharge voltage level comprising coupling the first and second signal lines of the local input/output line to the inter voltage supply.

36. A method of coupling read data from first and second signal lines of a local input/output line to an output buffer, comprising:

coupling first and second signal lines of a global input/output line to an internal voltage supply;

decoupling either the first or second signal line of the global input/output line from the internal voltage supply in response to the coupling of the read data to the first and second signal lines of the local input/output line;

developing a voltage differential at first and second nodes in response to a current differential resulting from the decoupling of the first or second signal line from the internal voltage supply, respectively;

driving the voltage of the decoupled signal line of the global input/output line at the respective node to a voltage level greater than the voltage level of the respective node of the signal line of the global input/output line coupled to the internal voltage supply; and coupling the first and second nodes to an input of the output buffer.

37. The method of claim 36 wherein developing a voltage differential at the first and second node comprises increasing a voltage drop across an active load coupled to the internal voltage supply in response to increasing current.

38. The method of claim 36 wherein driving the voltage of the decoupled signal line of the global input/output line comprises latching the voltage levels at that first and second nodes through cross coupled n-channel MOS transistors.

* * * * *

UNITED STATES PATENT AND TRADEMARK OFFICE

CERTIFICATE OF CORRECTION

PATENT NO. : 6,944,066 B1
APPLICATION NO. : 10/835704
DATED : September 13, 2005
INVENTOR(S) : Chul Min Jung It is certified that error appears in the above-identified patent and that said Letters Patent is hereby corrected as shown below:

| Column, Line | Reads | Should Read |
|---|---|---|
| Item (75) | Inventor: **Chul Min Jing**, Boise, ID (US) | Investor: **Chul Min Jung,** Boise, ID (US) |
| Item (56),References Cited, U.S. Patent Documents | [Omitted Reference | --5,483,353 B2 11/02 Kim et al......327/55 |
| Column 2, Line 33 | "have a complemen-" | --have complement-- |
| Column 3, Line 17 | " and the pass-gates" | --and the pass gates-- |
| Column 3, Line 19 | "in the pairs of signals" | --in the pairs of signal-- |
| Column 3, Line 27 | "becomes cutoff." | --becomes cut off.-- |
| Column 3, Line 37 | "mode operation of" | --mode of operation of-- |
| Column 6, Line 23 | "Prior to voltage level" | --Prior to the voltage level-- |
| Column 7, Lines 39-40 | "changing quickly as the voltage" | --changing quickly. As the voltage-- |
| Column 10, Line 56 | "circuits comprises first" | --circuits comprise first-- |
| Column 12, Line 14 | "amplifier comprises" | --aplifier comprise-- |
| Column 12, Line 26 | "control circuit" | --control circuit;-- |

UNITED STATES PATENT AND TRADEMARK OFFICE

CERTIFICATE OF CORRECTION

PATENT NO. : 6,944,066 B1
APPLICATION NO. : 10/835704
DATED : September 13, 2005
INVENTOR(S) : Chul Min Jung It is certified that error appears in the above-identified patent and that said Letters Patent is hereby corrected as shown below:

| | | |
|---|---|---|
| Column 13, Line 47 | "control circuit" | --control circuit;-- |
| Column 15, Line 12 | "supply comprise" | --supply comprises-- |
| Column 15, Line 28 | "level comprising" | --level comprises-- |
| Column 15, Line 29 | "to the inter" | --to the inter- -- |
| Column 16, Line 29 | "at that first and second" | --at the first and second-- |

Signed and Sealed this

Eighth Day of August, 2006

JON W. DUDAS
*Director of the United States Patent and Trademark Office*

UNITED STATES PATENT AND TRADEMARK OFFICE

CERTIFICATE OF CORRECTION

PATENT NO. : 6,944,066 B1
APPLICATION NO. : 10/835704
DATED : September 13, 2005
INVENTOR(S) : Chul Min Jung It is certified that error appears in the above-identified patent and that said Letters Patent is hereby corrected as shown below:

| Column, Line | Reads | Should Read |
|---|---|---|
| Item (75) | Inventor: **Chul Min Jing**, Boise, ID (US) | Inventor: **Chul Min Jung,** Boise, ID (US) |
| Item (56),References Cited, U.S. Patent Documents | [Omitted Reference | --5,483,353 B2 11/02 Kim et al......327/55 |
| Column 2, Line 33 | "have a complemen-" | --have complement-- |
| Column 3, Line 17 | " and the pass-gates" | --and the pass gates-- |
| Column 3, Line 19 | "in the pairs of signals" | --in the pairs of signal-- |
| Column 3, Line 27 | "becomes cutoff." | --becomes cut off.-- |
| Column 3, Line 37 | "mode operation of" | --mode of operation of-- |
| Column 6, Line 23 | "Prior to voltage level" | --Prior to the voltage level-- |
| Column 7, Lines 39-40 | "changing quickly as the voltage" | --changing quickly. As the voltage-- |
| Column 10, Line 56 | "circuits comprises first" | --circuits comprise first-- |
| Column 12, Line 14 | "amplifier comprises" | --aplifier comprise-- |
| Column 12, Line 26 | "control circuit" | --control circuit;-- |

UNITED STATES PATENT AND TRADEMARK OFFICE

CERTIFICATE OF CORRECTION

PATENT NO. : 6,944,066 B1
APPLICATION NO. : 10/835704
DATED : September 13, 2005
INVENTOR(S) : Chul Min Jung It is certified that error appears in the above-identified patent and that said Letters Patent is hereby corrected as shown below:

| | | |
|---|---|---|
| Column 13, Line 47 | "control circuit" | --control circuit;-- |
| Column 15, Line 12 | "supply comprise" | --supply comprises-- |
| Column 15, Line 28 | "level comprising" | --level comprises-- |
| Column 15, Line 29 | "to the inter" | --to the inter- -- |
| Column 16, Line 29 | "at that first and second" | --at the first and second-- |

This certificate supersedes Certificate of Correction issued August 8, 2006.

Signed and Sealed this

Twenty-fourth Day of October, 2006

JON W. DUDAS
*Director of the United States Patent and Trademark Office*

UNITED STATES PATENT AND TRADEMARK OFFICE

CERTIFICATE OF CORRECTION

PATENT NO. : 6,944,066 B1
APPLICATION NO. : 10/835704
DATED : September 13, 2005
INVENTOR(S) : Chul Min Jung It is certified that error appears in the above-identified patent and that said Letters Patent is hereby corrected as shown below:

| Column, Line | Reads | Should Read |
|---|---|---|
| Item (75) | Inventor: **Chul Min Jing**, Boise, ID (US) | Inventor: **Chul Min Jung,** Boise, ID (US) |
| Item (56),References Cited, U.S. Patent Documents | [Omitted Reference | --5,483,353 B2 11/02 Kim et al......327/55 |
| Column 2, Line 33 | "have a complemen-" | --have complement-- |
| Column 3, Line 17 | " and the pass-gates" | --and the pass gates-- |
| Column 3, Line 19 | "in the pairs of signals" | --in the pairs of signal-- |
| Column 3, Line 27 | "becomes cutoff." | --becomes cut off.-- |
| Column 3, Line 37 | "mode operation of" | --mode of operation of-- |
| Column 6, Line 23 | "Prior to voltage level" | --Prior to the voltage level-- |
| Column 7, Lines 39-40 | "changing quickly as the voltage" | --changing quickly. As the voltage-- |
| Column 10, Line 56 | "circuits comprises first" | --circuits comprise first-- |
| Column 12, Line 14 | "amplifier comprises" | --amplifier comprise-- |
| Column 12, Line 26 | "control circuit" | --control circuit;-- |

UNITED STATES PATENT AND TRADEMARK OFFICE

CERTIFICATE OF CORRECTION

PATENT NO. : 6,944,066 B1
APPLICATION NO. : 10/835704
DATED : September 13, 2005
INVENTOR(S) : Chul Min Jung It is certified that error appears in the above-identified patent and that said Letters Patent is hereby corrected as shown below:

| | | |
|---|---|---|
| Column 13, Line 47 | "control circuit" | --control circuit;-- |
| Column 15, Line 12 | "supply comprise" | --supply comprises-- |
| Column 15, Line 28 | "level comprising" | --level comprises-- |
| Column 15, Line 29 | "to the inter" | --to the inter- -- |
| Column 16, Line 29 | "at that first and second" | --at the first and second-- |

This certificate supersedes Certificate of Correction issued August 8, 2006 and October 24, 2006.

Signed and Sealed this

Second Day of January, 2007

JON W. DUDAS

*Director of the United States Patent and Trademark Office*